(12) United States Patent
Miwa et al.

(10) Patent No.: US 7,286,386 B2
(45) Date of Patent: Oct. 23, 2007

(54) SEMICONDUCTOR DEVICE

(75) Inventors: Takashi Miwa, Fussa (JP); Yasumi Tsutsumi, Higashiyamato (JP); Masahiro Ichitani, Kodaira (JP); Takanori Hashizume, Higashiyamato (JP); Masamichi Sato, Hachioji (JP); Naozumi Morino, Higashiyamato (JP); Atsushi Nakamura, Tachikawa (JP); Saneaki Tamaki, Kodaira (JP); Ikuo Kudo, Koganei (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/401,284

(22) Filed: Apr. 11, 2006

(65) Prior Publication Data

US 2006/0180943 A1   Aug. 17, 2006

Related U.S. Application Data

(62) Division of application No. 10/606,891, filed on Jun. 27, 2003, now Pat. No. 7,061,785.

(30) Foreign Application Priority Data

Aug. 6, 2002   (JP) .............................. 2002-229250

(51) Int. Cl.
*G11C 5/06* (2006.01)
*H01L 23/48* (2006.01)

(52) U.S. Cl. ............................ 365/63; 365/51; 365/52; 257/777; 257/784; 257/786

(58) Field of Classification Search ................. 365/51, 365/52, 63; 257/777, 723, 784, 773, 786
See application file for complete search history.

(56) References Cited

U.S. PATENT DOCUMENTS

| 4,442,507 | A | | 4/1984 | Roesner ...................... 365/100 |
| 4,962,415 | A | * | 10/1990 | Yamamoto et al. ......... 257/679 |
| 6,365,966 | B1 | | 4/2002 | Chen et al. .................. 257/723 |
| 7,061,785 | B2 | * | 6/2006 | Miwa et al. .................. 365/63 |

FOREIGN PATENT DOCUMENTS

JP    2002-043531    2/2002

\* cited by examiner

*Primary Examiner*—Andrew Q. Tran
(74) *Attorney, Agent, or Firm*—Miles & Stockbridge P.C.

(57) ABSTRACT

A semiconductor device uses a package substrate on which bonding leads are formed respectively corresponding to bonding pads for address and data which are distributed to opposing first and second sides of a memory chip and address terminals and data terminals which are connected to the bonding leads. The semiconductor device further includes an address output circuit and a data input/output circuit which also serves for memory access and a signal processing circuit having a data processing function. A semiconductor chip having bonding pads connected to the bonding leads corresponding to the address terminals of the package substrate and bonding pads connected to the bonding leads corresponding to the data terminals of the package substrate and distributed to two sides out of four sides and the above-mentioned memory chip are mounted on the package substrate in a stacked structure. Bonding leads arranged along at least one side of the substrate may include bonding leads of rectangular configuration having longer sides disposed at acute angles with respect to the side of the substrate.

12 Claims, 17 Drawing Sheets

SEMICONDUCTOR DEVICE

CROSS-REFERENCE TO RELATED APPLICATION

This application is a division of application Ser. No. 10/606,891 filed Jun. 27, 2003 (now U.S. Pat. No. 7,061,785 issued Jun. 13, 2006).

BACKGROUND OF THE INVENTION

The present invention relates to a semiconductor device, and more particularly to a technique which is effectively applicable to a semiconductor device in which a plurality of semiconductor chips are mounted on a package substrate in a laminated or stacked structure.

In a stacked LSI (Large-sized Integrated Circuit) which assembles semiconductor chips on a package substrate in a laminated or stacked structure, in many cases existing semiconductor chips are combined and common signals and power source/ground are connected via wiring layers of the package. Due to a prior art search which was carried out after the present invention was made, as a prior art related to the present invention, a technique disclosed in Japanese Unexamined Patent Publication 43531/2000 is reported. However, the technique disclosed in this publication aims at the reduction of time and effort necessary for designing and development of types of standard package LSI, but lacks deliberation towards miniaturizing of the package and thinning of a contour size of the package substrate.

SUMMARY OF THE INVENTION

With respect to the common signals and power source/ground in two chips which constitute the stacked package LSI, their pads are not always arranged in positions where they can be connected easily between the chips. Accordingly, even when the wiring layers are connected on the package substrate, in many cases there exist crossing wiring layers or wiring layers are arranged densely. In these cases, the number of wiring layers of the package substrate is increased or a contour size is increased, thus obstructing the miniaturization and thinning of the semiconductor device. Since connection terminals of mounting chips are formed individually, a large terminal arrangement area becomes necessary, and this also becomes a cause of an increase in the contour size of the package.

FIG. 19 to FIG. 21 show examples of a stacked package LSI which was reviewed prior to arriving at the present invention. A microcomputer LSI and a memory LSI are respectively constituted of existing semiconductor chips. In FIG. 19, the microcomputer LSI, the memory LSI and a package substrate which constitute the stacked package LSI are respectively shown. The microcomputer LSI and the memory LSI are respectively constituted of the existing semiconductor chips. FIG. 20 shows the stacked package LSI after mounting the memory LSI and the microcomputer LSI onto the substrate, and also the bonding wiring. FIG. 21 shows a cross-sectional view of the stacked package LSI shown in FIG. 20.

As shown in FIG. 19 to FIG. 21, the stacked package LSI adopts a structure which is formed as follows. The memory LSI is die-bonded to the package substrate made of glass epoxy-based resin. Then, the microcomputer LSI is die-bonded to the memory LSI in a superposed manner and respective chips and the substrates are connected to each other by wire bonding. Thereafter, these components are molded by resin and solder balls are formed on back-surface terminal portions.

In FIG. 19, address terminals and data terminals which are connected with memories or the like are collectively arranged at sides of the microcomputer LSI which are disposed close to each other. Due to such a constitution, when the microcomputer LSI, the memory LSI and the like are mounted on the substrate in plane, it is possible to arrange an address bus and a data bus directed to the memory and the like on the substrate with the shortest distance therebetween and in a collective manner. On the other hand, with respect to the memory LSI, in view of the characteristics thereof that the number of terminals is small and corresponding to the external terminal arrangement of a standard package, the address terminals are mainly arranged at one side and the data terminals are arranged at another side which faces the one side in an opposed manner.

When the above-mentioned microcomputer LSI and memory LSI on which the bonding pads are arranged respectively are stacked or laminated to the package substrate and the directions of the address terminals of the microcomputer LSI and the memory LSI are aligned, for example, the directions of data terminals of the microcomputer LSI and the memory LSI are not aligned and hence, it is necessary to pull around wiring layers on the package substrate for wiring connection. Further, also with respect to the aligned address terminals, the pitch of the bonding pad arrangement differs between the microcomputer LSI and the memory LSI, and hence it may be necessary to form terminals on the microcomputer LSI and the memory LSI independently from each other in most cases.

Accordingly, in the package substrate, the number of bonding terminals (bonding leads) is increased, and hence the bonding leads cannot be arranged in a row and it is necessary to arrange the bonding leads in two rows as in the case of the example shown in FIG. 20. From this arises a drawback in that the contour size of the package substrate is enlarged. Further, depending on the arrangement of terminals of the microcomputer LSI and the memory LSI to be connected to each other, there arises a case in which wiring layers on the package substrate cross each other, and hence it is necessary to provide a multi-layered printed wiring board. This also gives rise to a drawback in that the thickness of contour sizes is also increased.

It is an object of the present invention to provide a semiconductor device having a stacked structure which can realize miniaturization and thinning of contour sizes.

It is another object of the present invention to provide a semiconductor device which can realize high performance and high reliability in addition to the miniaturization of the contour size. The above-mentioned and other objects and novel features of the present invention will become apparent from the description of this specification and attached drawings.

To briefly describe the summary of typical inventions out of inventions disclosed in the present invention, they are as follows.

According to one aspect of the present invention, a semiconductor device uses a package substrate which includes bonding leads which are formed respectively corresponding to bonding pads for address and bonding pads for data which are distributed to a first side and a second side of a memory chip facing each other in an opposed manner, and address terminals and data terminals which are connected to the bonding leads. A semiconductor chip includes an address output circuit and a data input/output circuit which also serves for memory access and a signal processing circuit having a data processing function, wherein the bonding pads which are connected to the bonding leads corresponding to the address terminals and the bonding pads which are connected to the bonding leads corresponding to the data terminals are distributed to and arranged on two sides out of four sides of the package substrate. The semiconductor chip and the memory chip are mounted on the package substrate in a stacked structure.

DETAILED DESCRIPTION OF PREFERRED EMBODIMENTS

Figure 1:
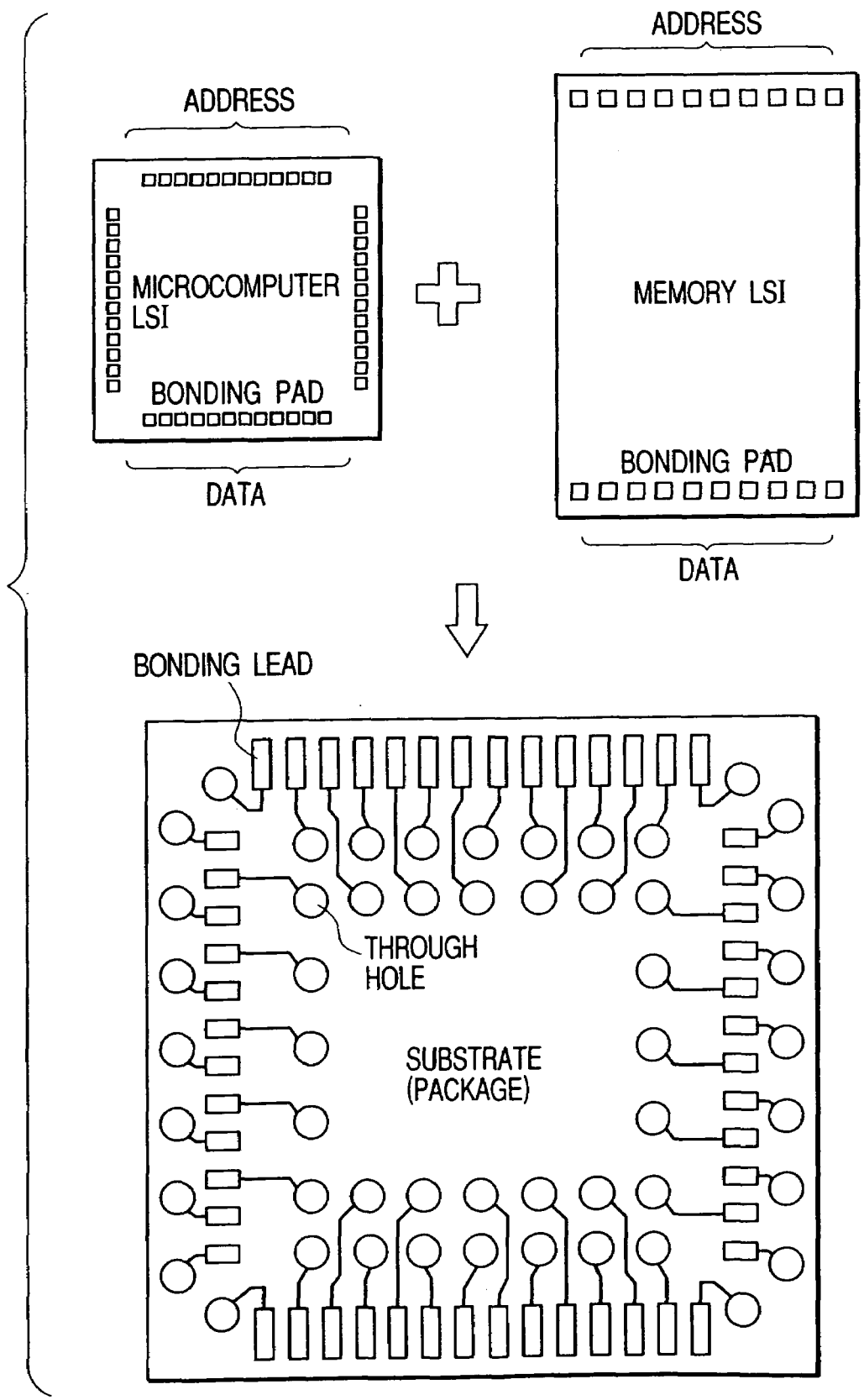
FIG. 1 is a view showing the constitution of a microcomputer LSI, a memory LSI and a package substrate for explaining one embodiment of a stacked package LSI according to the present invention.
Figure 2:
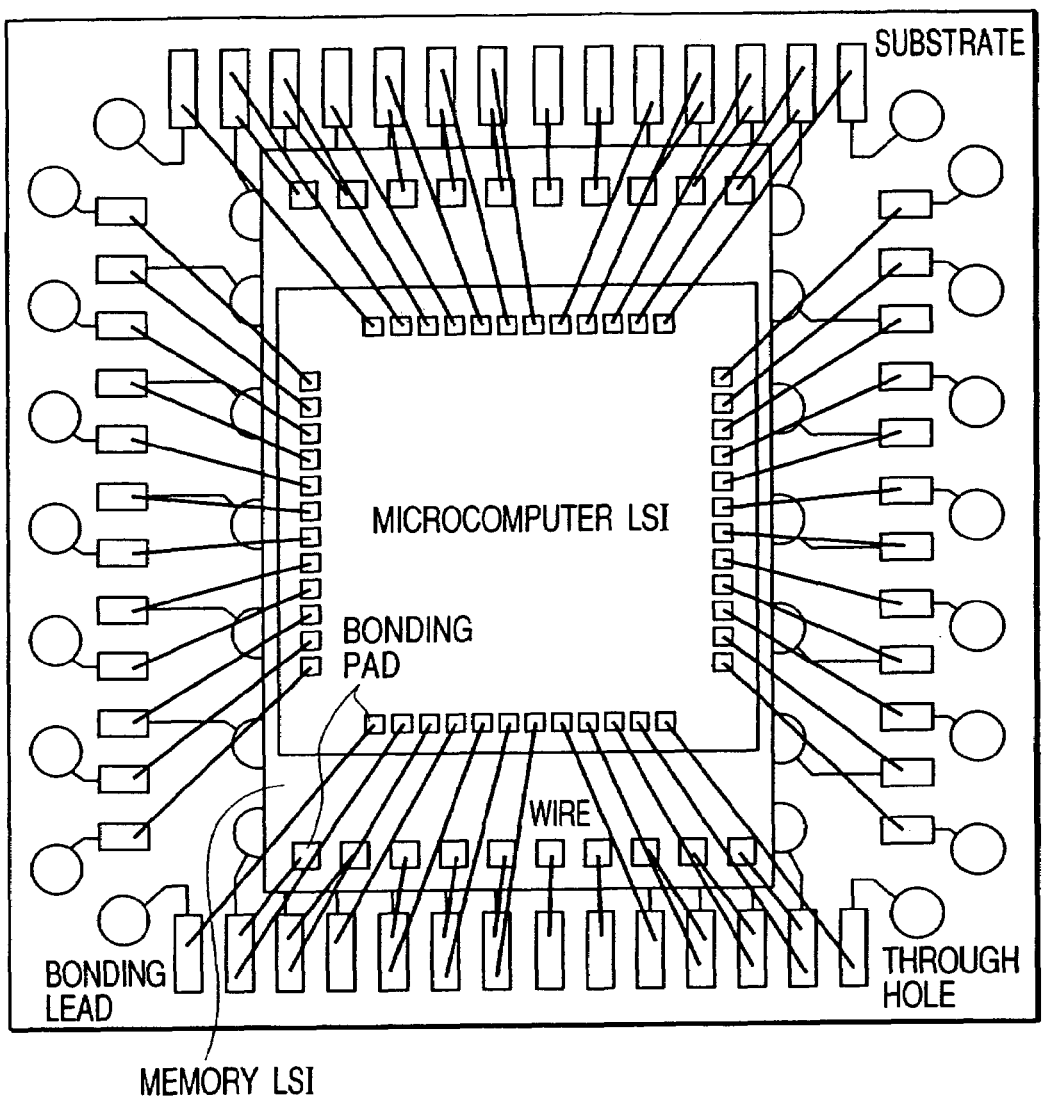
FIG. 2 is an appearance view of the semiconductor device after mounting the memory LSI and the microcomputer LSI on the substrate shown in FIG. 1 and performing wire bonding thereafter.
Figure 3:
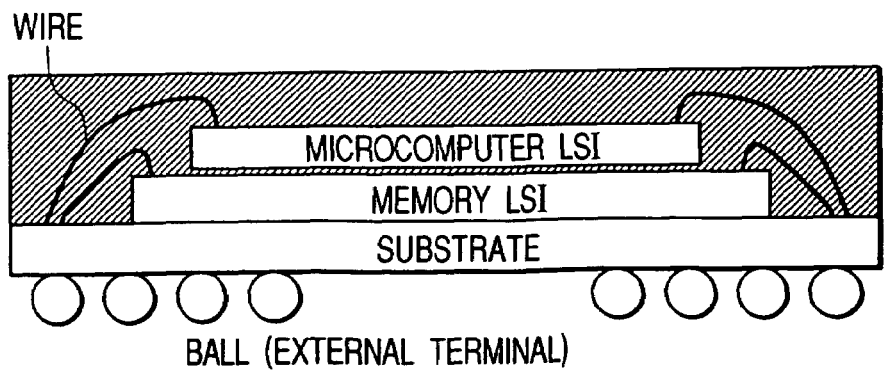
FIG. 3 is a cross-sectional view of one embodiment of the stacked package LSI shown in FIG. 2.

In FIG. 1 to FIG. 3, the constitution of one embodiment of a stacked package LSI according to the present invention is shown. That is, in FIG. 1, a microcomputer LSI, a memory LSI and a package substrate which constitute the stacked package LSI are respectively shown. In FIG. 2, an appearance of the stacked package LSI in a state which the memory LSI and the microcomputer LSI are mounted on the substrate and, thereafter, the wire bonding is performed is shown. FIG. 3 shows a cross-section of the stacked package LSI. As shown in FIG. 1 to FIG. 3, the stacked package LSI of this embodiment has a structure which is formed as follows. That is, the memory LSI is die-bonded to the package substrate made of glass epoxy resin. Then, the microcomputer LSI is superposed on and is die-bonded to the memory LSI. Wire bonding is performed between the respective chips and the substrate. Thereafter, the respective chips and the substrate are molded with resin and solder balls are formed on back-surface terminal portions.

In FIG. 1, while the memory LSI is constituted of an existing semiconductor chip, the arrangement of bonding pads of the microcomputer LSI is determined corresponding to the memory LSI which is combined with the microcomputer LSI. The microcomputer LSI is configured to constitute a so-called ASIC (Application Specified Integrated Circuit), that is, a specific-use IC. In a semiconductor integrated circuit device, to easily constitute an ASIC in which a plurality of circuit blocks are mounted around a CPU (central processing unit), respective circuit blocks are formed into so-called modules or macro cells as independent circuit functional units. The magnitude and constitution of each functional unit can be changed. Setting of the arrangement of the bonding pads of the microcomputer LSI corresponding to the above-mentioned combination of the microcomputer LSI with the memory LSI is performed along with layout designing of the functional blocks corresponding to the combination of the above-mentioned functional units.

With respect to the package substrate (wiring substrate), the arrangement of bonding leads (wire connecting portions) is set corresponding to the arrangement of the above-mentioned bonding pads between the microcomputer LSI and the memory LSI. The above-mentioned package substrate includes a base substrate made of glass epoxy resin, for example, a plurality of copper wiring layers which are formed on an upper surface and a lower surface thereof, insulation films (solder resist films) which cover surfaces of the above-mentioned plurality of copper wiring layers at portions other than the above-mentioned wire connecting portions and external terminal connecting portions (bump lands), and through-hole wiring layers which connect a plurality of copper wiring layers formed on the above-mentioned upper surface and lower surface to each other.

The memory LSI is, although it is not particularly limited, a static type RAM which has a storage capacitance of approximately 8 Mbits. The shape of the semiconductor chip is formed into a rectangular shape and address and data are distributed to short sides where bonding pads are formed. Compared to the memory LSI having such a constitution, the microcomputer LSI has a substantially square chip shape and has a contour size smaller than that of the above-mentioned LSI. Accordingly, as mentioned above, the stacked package LSI is constituted such that the memory LSI is die-bonded to the package substrate, the microcomputer LSI is superposed on and is die-bonded to the memory LSI, and wire bonding is performed between respective chips and the substrate.

To reduce the contour size, the above-mentioned package substrate is formed into a substantially square shape to ensure the largest area with respect to the outer circumference. In such a constitution, there exists no area margin at the short sides of the memory LSI, and hence the bonding leads which are indicated by a rectangular shape are arranged along the outer circumference, and the pullout direction of wiring layers extending from the through-holes is directed to an inner portion of the package substrate. On the contrary, since there is more area margin at long sides of the memory LSI, the through-holes are arranged such that they are distributed alternately at both sides of the bonding leads to sandwich the bonding leads.

Figure 21:
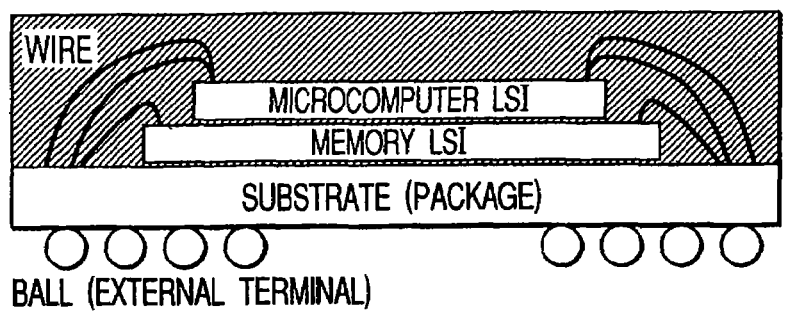
FIG. 21 is a cross-sectional view of the stacked package LSI shown in FIG. 20.

As described above, in the microcomputer LSI, the address terminals and the data terminals are arranged in a concentrated manner on the sides which face each other. Further, a group of terminals which do not contribute to the connection with the memory LSI are mainly arranged on sides other than the above-mentioned sides. Accordingly, the possibility that the directions of terminals which are connected to each other are not aligned even when the microcomputer LSI is stacked on the memory LSI is eliminated. Further to prevent the wires from crossing each other in a complicated manner at the time of performing stacking and bonding, the microcomputer LSI has a pitch thereof adjusted in conformity with a pitch of the terminals of the memory LSI. That is, compared to a case in which the wires cross each other in a complicated manner, that is, a case in which three wires are superposed in the vertical direction as shown in FIG. 21, for example, a case in which two wires are superposed by eliminating crossing as shown in FIG. 3 can reduce a thickness of a mold (sealed resin body).

Although the above-mentioned pitch adjustment can be performed by simply adjusting the distance, in this embodiment, the pitch adjustment is performed by arranging terminals having other functions to the row of address terminals or the row of data terminals. Since the pitch adjustment is performed in this manner, the terminals of the microcomputer LSI and the terminals of the memory LSI which are to be connected to each other can be bonded to the same substrate-side pads, whereby it is unnecessary to pull around wiring layers for connecting between the terminals on the package substrate. As a result, it is enough for the package substrate to have wiring connection from the bonding leads to ball terminals for external connection, and hence sufficient required functions can be performed by the two-layered wiring layers formed on a front surface and a back surface of the substrate. The constitution provided with such a pitch adjustment contributes to thinning of the stacked package LSI along with thinning of the above-mentioned mold. Since the bonding leads are substantially used in common by the microcomputer LSI and the memory LSI, the number of leads can be suppressed to a necessary minimum whereby the contour size can be miniaturized.

With respect to the leads of the sides which are bonded in common by the microcomputer LSI and the memory LSI, the length of the leads is elongated such that the wires which are directed and connected to the microcomputer LSI and the memory LSI can be bonded in parallel in the vertical direction. On the other hand, as in the case of the bonding leads which correspond to the long sides of the memory LSI, the leads on the sides to which only the microcomputer LSI is bonded is retained to a length which allows bonding of one wire, thus preventing the wiring layer region from becoming larger than necessary.

Although the length of the bonding leads is changed in accordance with every side in this embodiment, the length of the bonding leads may be changed in accordance with a plurality of leads to be bonded without changing the length of the bonding leads in accordance with every side. Another characteristic of this embodiment related to the miniaturization lies in that since the memory chip has a rectangular shape as described above, the side on which the bonding leads of the memory chip are arranged has no margin in the contour size, whereby the bonding leads are arranged at the outermost circumference and the through-holes are arranged to be directed to the inner circumference. On the other hand, with respect to the sides to which only the microchip is bonded, the through-holes are arranged such that they are distributed to the inside and the outside of the bonding leads.

Figure 4:
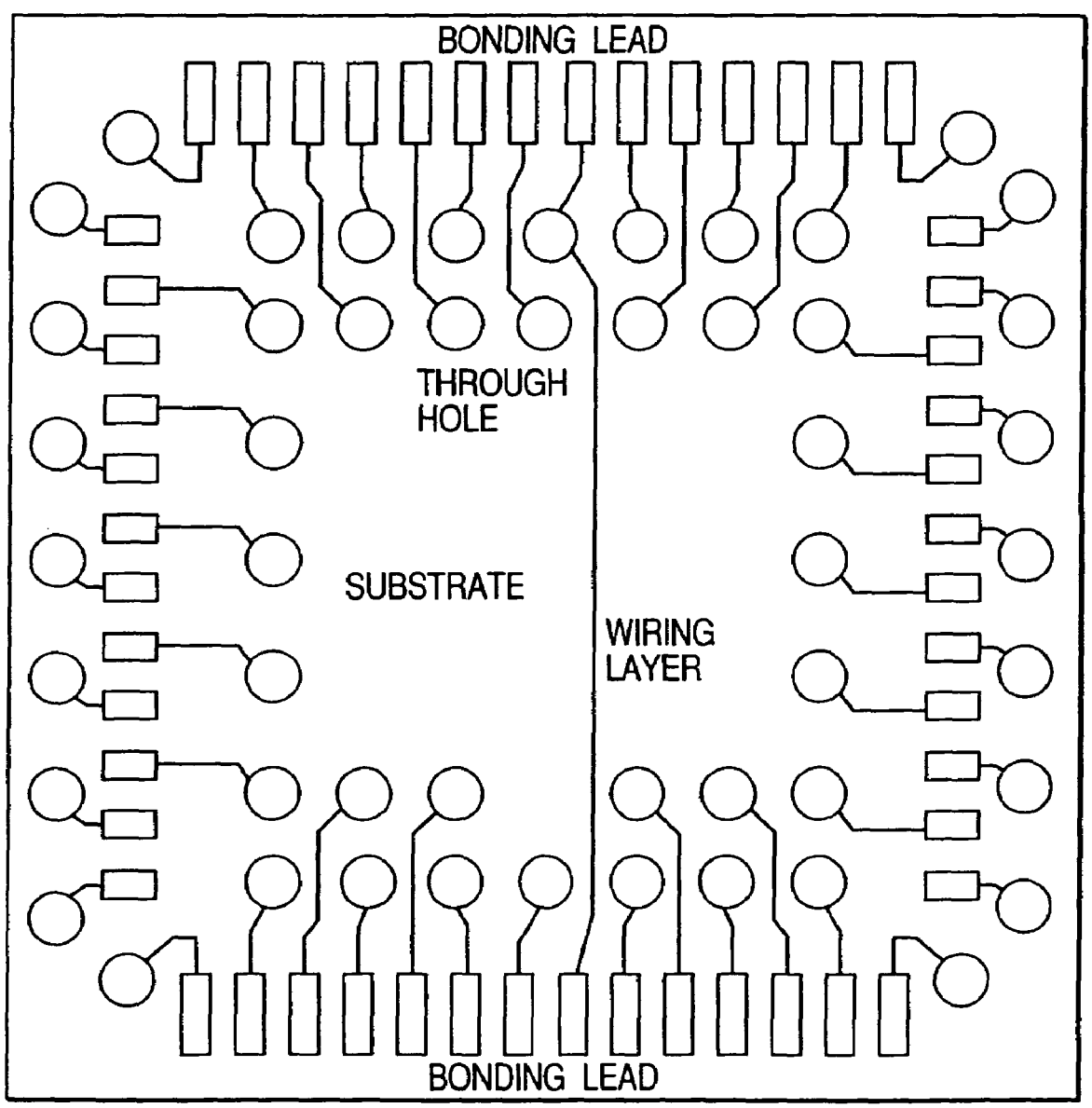
FIG. 4 is a top plan view showing another embodiment of the package substrate used by the present invention.

FIG. 4 is a top plan view showing another embodiment of the package substrate used in the present invention. In the above-mentioned embodiment shown in FIG. 1, the addresses or data of the memory LSI and the microcomputer LSI are completely arranged on the same sides. However, in view of the relationship with the layout of the chips, the addresses and the data are not always concentrated on the sides which face each other in an opposed manner. Further, even when the addresses and data are completely separated at the sides which face each other in an opposed manner, signals for control, for example, control signals such as read/write signals, chip select signals and output enable signals which the microcomputer and the memory use do not always agree with each other.

In this embodiment, with respect to the microcomputer LSI and the memory LSI, when the same terminals or the terminals (bonding pads) to be connected with each other are arranged on the sides which face each other in an opposed manner, wiring layers which bridge the opposing sides are formed on the substrate. By concentrating the most signals (addresses and data) to be connected to each other by the microcomputer LSI and the memory LSI to the same sides, the number of bridging wire layers can be minimized. Accordingly, it is possible to sufficiently perform the required function using two-layered wiring which are formed on the front surface and the back surface of the substrate.

Figure 5:
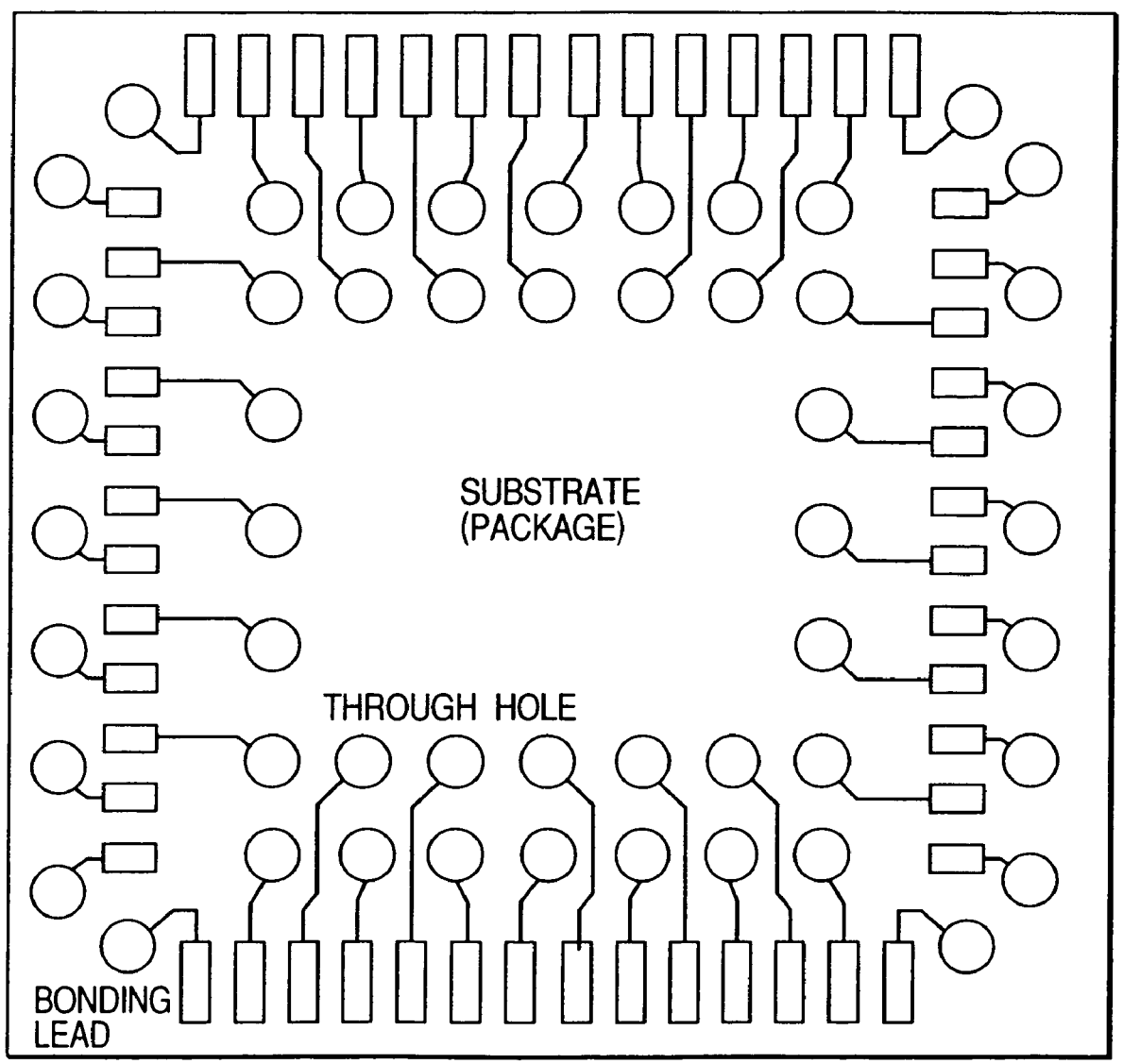
FIG. 5 is a top plan view showing another embodiment of the package substrate used by the present invention.
Figure 6:
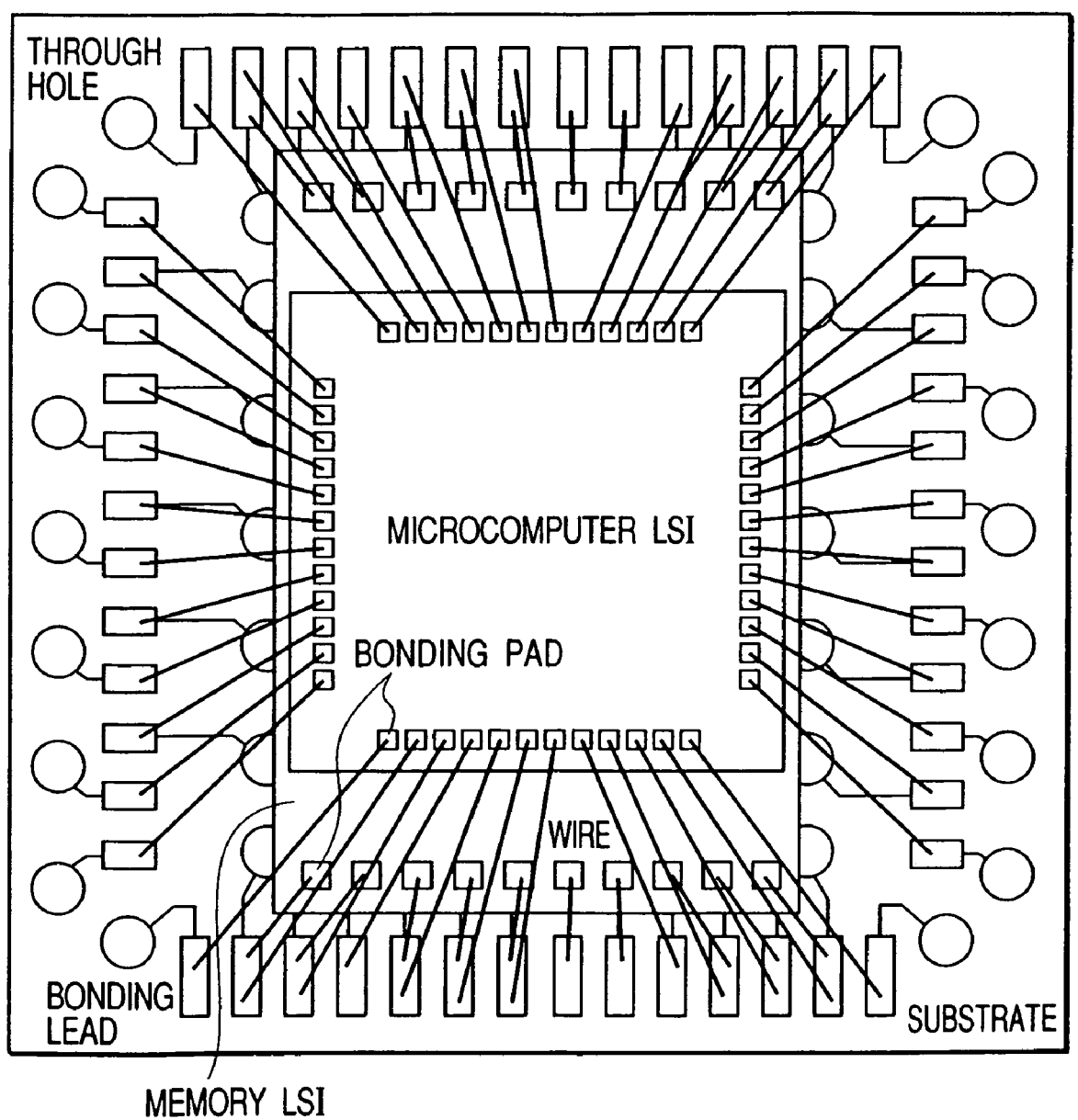
FIG. 6 is an appearance view of the semiconductor device after mounting the memory LSI and the microcomputer LSI on the substrate shown in FIG. 5 and performing wire bonding thereafter.

FIG. 5 is a top plan view of another embodiment of the package substrate used in the present invention. This embodiment is directed to the shape of the bonding leads. The embodiment shown in FIG. 5 shows an example of the package substrate in which the rectangular bonding leads are arranged in the same manner as the embodiment shown in FIG. 1. FIG. 6 shows an appearance of a stacked package LSI in which a memory LSI and a microcomputer LSI are mounted on a package substrate in a stacked manner. The embodiment shown in FIG. 6 also corresponds to the embodiment shown in FIG. 2.

In this embodiment, with respect to bonding leads which perform wire bonding in common between the memory LSI and the microcomputer LSI, to bond at least two wires to the bonding lead, it is necessary to connect wires of the microcomputer LSI to the deep side of the lead (outside of the lead). Then, as a result of the arrangement in which the bonding pads of the microcomputer LSI are arranged collectively at portions close to the center of the substrate, the wires are directed in the radial direction such that they are concentrated at positions close to the center of the substrate. As a result, portions of the wires pass over neighboring leads, thus giving rise to a problem that the potential of short-circuiting between neighboring leads and the wire is high.

Figure 7:
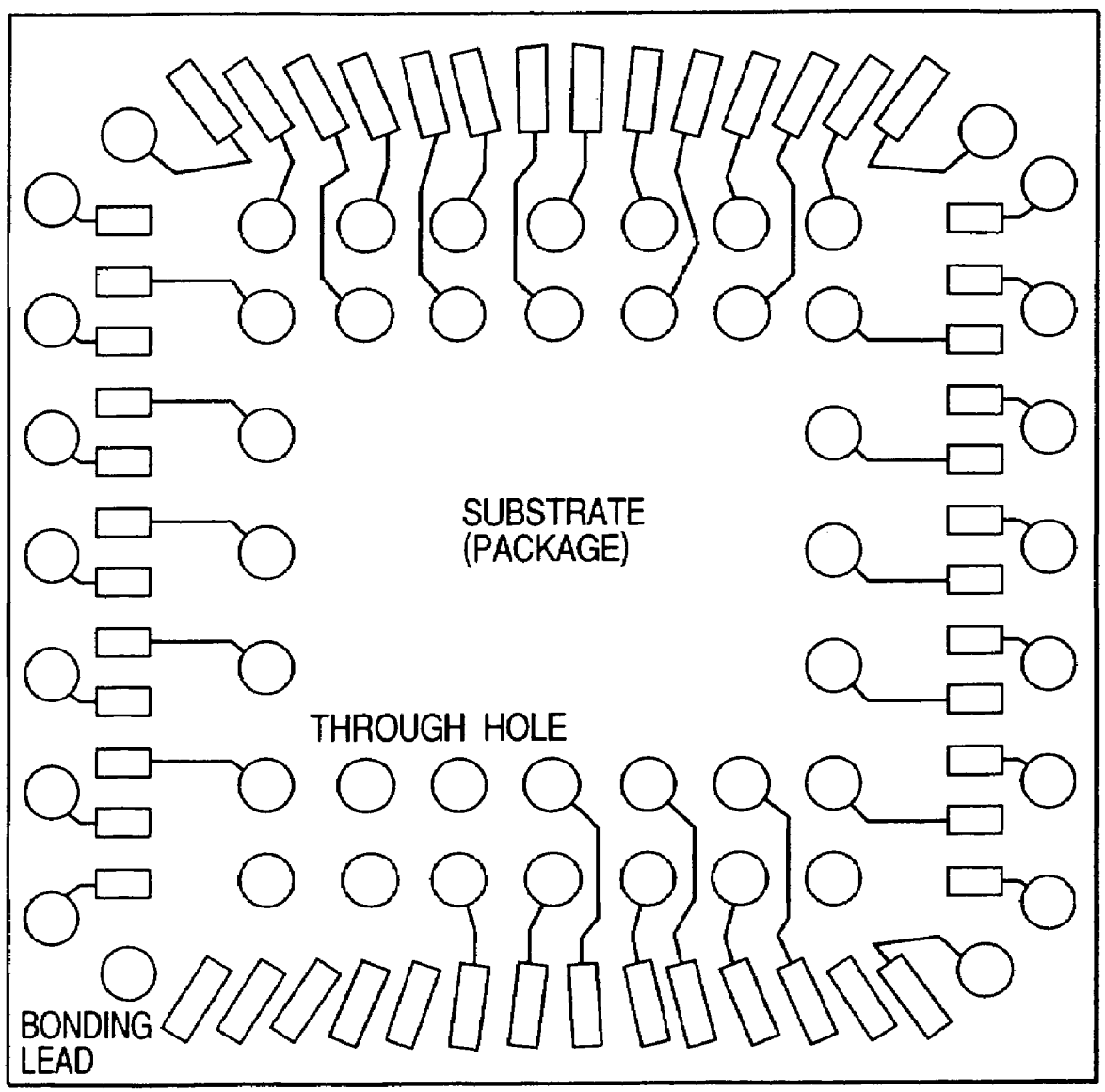
FIG. 7 is a top plan view showing another embodiment of the package substrate used by the present invention.
Figure 8:
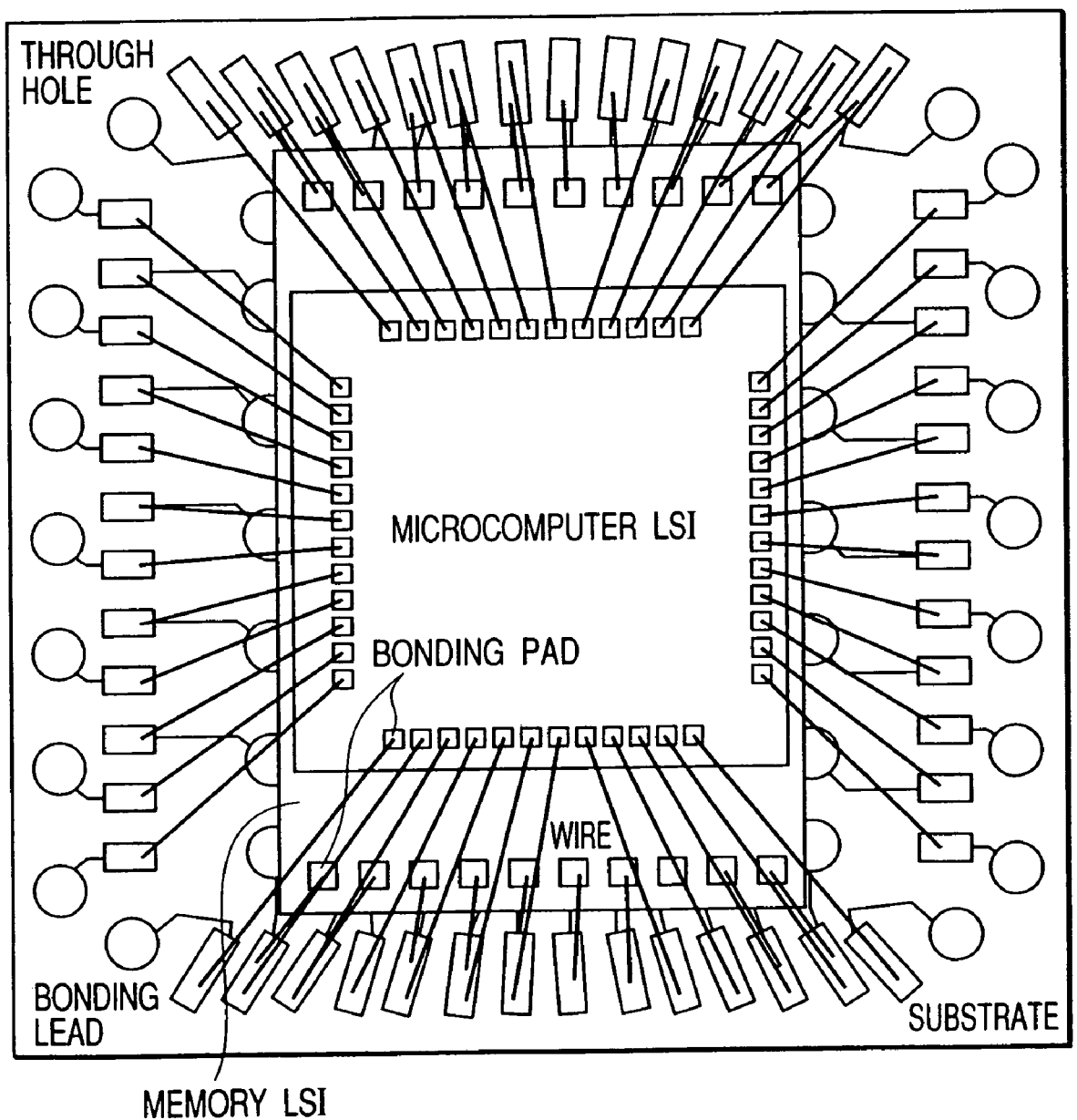
FIG. 8 is an appearance view of the semiconductor device after mounting the memory LSI and the microcomputer LSI on the substrate shown in FIG. 7 and performing wire bonding thereafter.

FIG. 7 is a top plan view showing another embodiment of the package substrate used in the present invention. This embodiment is directed to a method for obviating a problem wherein portions of wires which are bonded while passing over other neighboring leads as in the embodiment shown in FIG. 5. In this embodiment, by taking the direction of wires which serve for connections between the bonding leads and the corresponding bonding pads of the microcomputer LSI and the memory LSI into consideration, the bonding leads are arranged in an oblique manner. FIG. 8 shows an appearance of a stacked package LSI in which the memory LSI and the microcomputer LSI are mounted on the package substrate in a stacked manner and wire bonding is performed thereafter.

In FIG. 8, with respect to the bonding leads which perform bonding in common with respect to the memory LSI and the microcomputer LSI, at least two wires are arranged in a radial direction such that they are directed toward the corresponding bonding pads of the microcomputer LSI and the memory LSI. Here, by making this direction and the longitudinal direction of the bonding leads substantially identical to each other, it is possible to eliminate portions of the wires which are bonded while passing over neighboring leads. Further, at the same time, it is possible to prevent the wires from crossing each other in a complicated manner so that only two wires at the maximum which correspond to the microcomputer LSI and the memory LSI are superposed on each other, whereby a thickness of a mold can be reduced.

Figure 9:
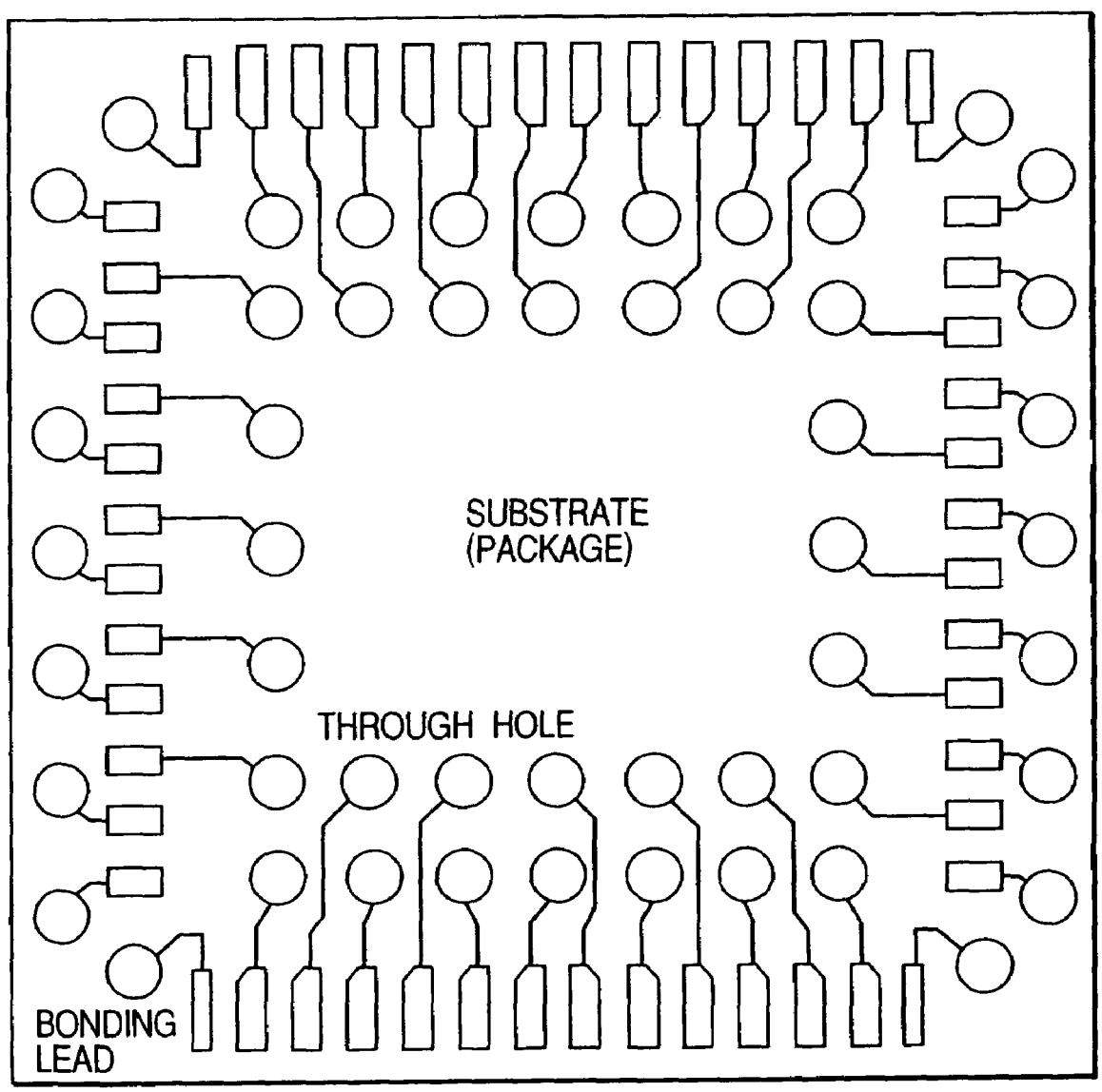
FIG. 9 is a top plan view showing another embodiment of the package substrate used by the present invention.
Figure 10:
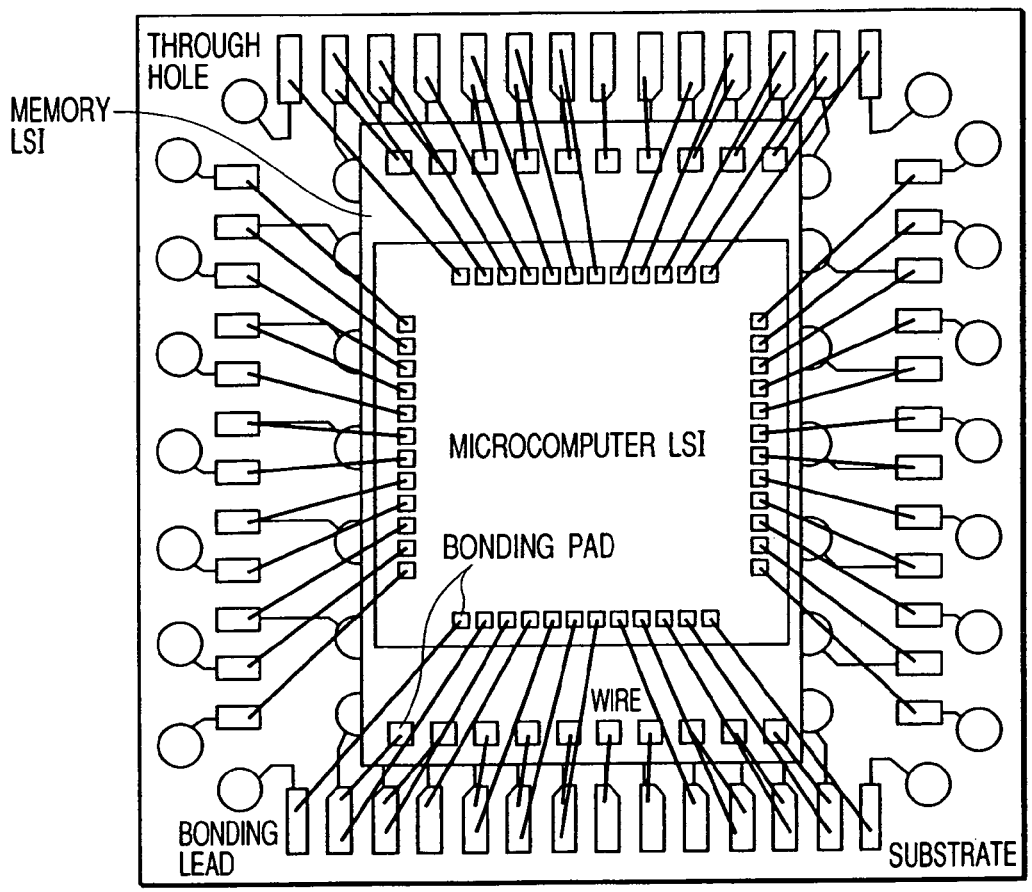
FIG. 10 is an appearance view of the semiconductor device after mounting the memory LSI and the microcomputer LSI on the substrate shown in FIG. 9 and performing wire bonding thereafter.

FIG. 9 is a top plan view showing another embodiment of the package substrate used in the present invention. This embodiment is directed to a method for obviating the problem that arises when portions of the wires which are bonded while passing over neighboring leads as in the embodiment shown in FIG. 5. In this embodiment, portions of the neighboring leads over which the wires pass are notched, and hence it is possible to shorten a pitch of the leads to a necessary minimum while reducing the potential of short-circuiting between the neighboring leads and the wires. FIG. 10 shows an appearance of a stacked package LSI in which the memory LSI and the microcomputer LSI are mounted on the package substrate in a stacked manner and wire bonding is performed thereafter.

In FIG. 10, as mentioned previously, with respect to the bonding leads which perform bonding in common with respect to the memory LSI and the microcomputer LSI, at least two wires are arranged in a radial direction such that they are directed toward the corresponding bonding pads of the microcomputer LSI and the memory LSI, and hence it is necessary to connect the wires of the microcomputer LSI to the deep side of the bonding lead (outside of the bonding lead). As a result, portions of the wires which are bonded pass over neighboring leads, and hence the potential of short-circuiting between the neighboring leads and the wires is increased. However, in this embodiment, the portion of the leads over which the neighboring wires pass are notched, and hence it is possible to obviate a drawback of short-circuiting between the neighboring leads and the wires.

Figure 11:
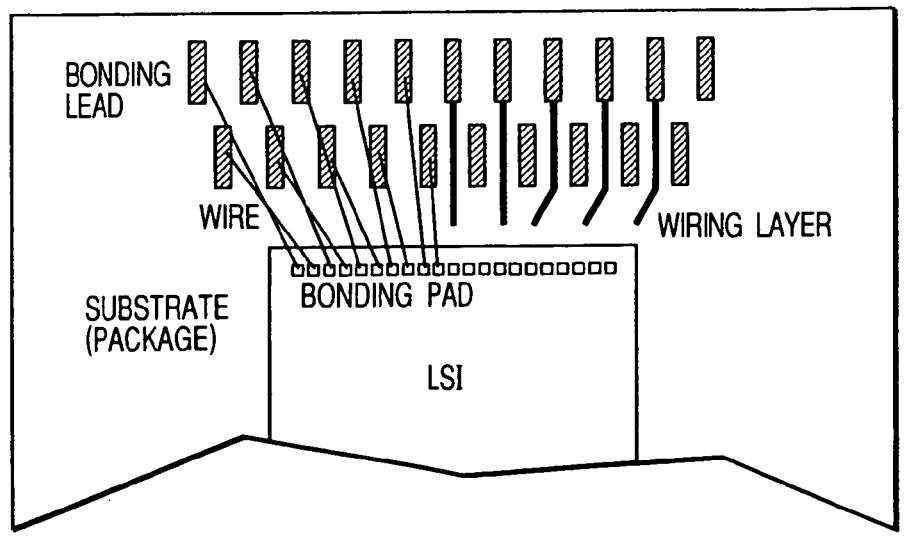
FIG. 11 is a partial appearance view showing another embodiment of the semiconductor device according to the present invention.

FIG. 11 is a partial appearance view of another embodiment of the semiconductor device according to the present invention. In this embodiment, a portion of the appearance when one semiconductor integrated chip LSI is mounted on a package substrate is shown. In this embodiment, with respect to the semiconductor chip mounted on the package substrate, one semiconductor chip LSI is mounted. It is needless to say that this embodiment is applicable to the structure in which another semiconductor chip is mounted on the semiconductor chip LSI in a stacked manner.

This embodiment is applicable to a case in which the number of bonding pads formed on the semiconductor chip LSI is large, and hence the bonding leads cannot be arranged in a row on the substrate. In this case, the bonding leads are arranged in two rows, wherein the inside row and the outside row are alternately arranged thus constituting a so-called staggered arrangement. This embodiment is provided for eliminating the superposition of the neighboring wires which connect the bonding leads and the bonding pads and for ensuring regions for forming wiring layers which extend from outside bonding leads to the through-holes formed inside.

Figure 12:
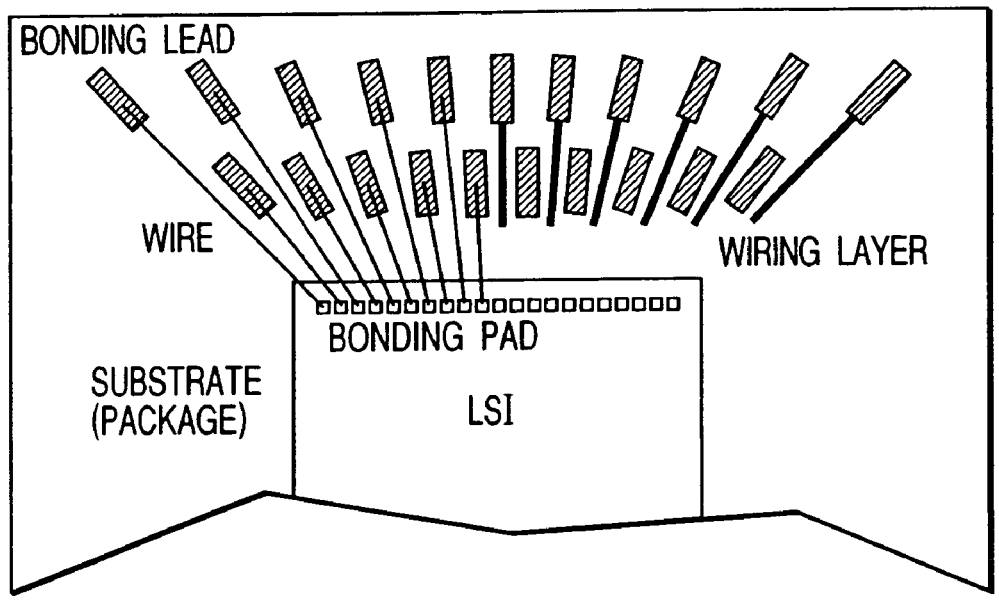
FIG. 12 is a partial appearance view showing another embodiment of the semiconductor device according to the present invention.

FIG. 12 is a partial appearance view showing another embodiment of the semiconductor device according to the present invention. This embodiment relates to an improvement of the embodiment shown in FIG. 11, wherein a portion of the appearance of the semiconductor device in a state which one semiconductor chip LSI is mounted on the package substrate is shown. In the embodiment shown in FIG. 11, portions of the wires which extend from the outside bonding leads and are bonded while passing over other leads in the inside, and hence there is a possibility that the potential of short-circuiting between the inside leads and the wires is increased.

In this embodiment, to obviate such a drawback, by considering the direction of the wires which serve for connecting the bonding leads and the corresponding pads of the semiconductor chip LSI, the bonding leads are arranged in an oblique manner. By arranging the bonding leads and the wires which are connected to the bonding leads in the radial direction such that they are aligned substantially in the same direction, it is possible to eliminate portions where the wires are bonded while passing over another leads disposed inside. Further, at the same time, it is possible to eliminate crossing of the wires, and hence short-circuiting of the wires can be prevented and the thickness of a mold can be reduced.

Figure 13:
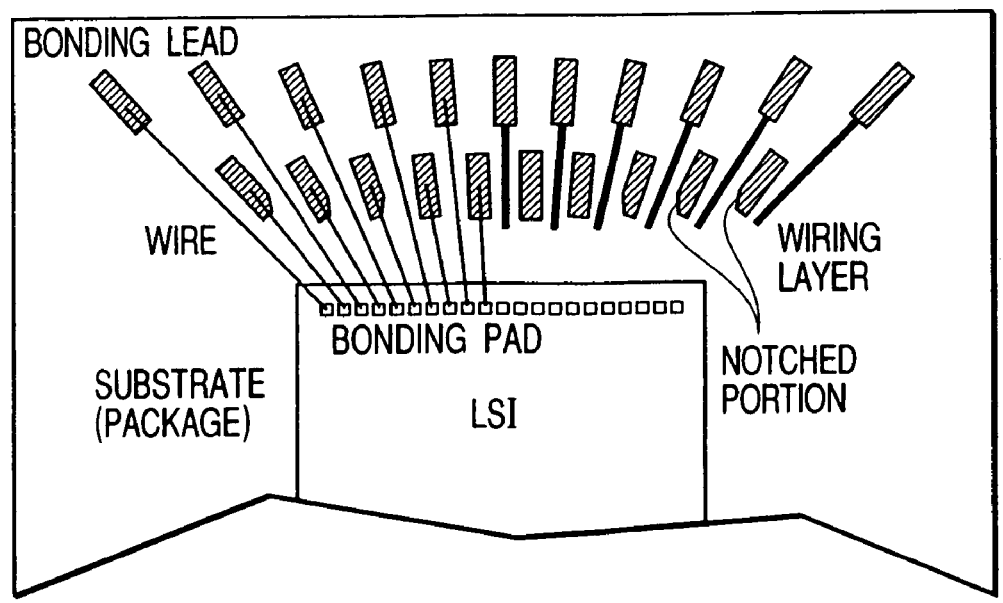
FIG. 13 is a partial appearance view showing another embodiment of the semiconductor device according to the present invention.

FIG. 13 is a partial appearance view of another embodiment of the semiconductor device according to the present invention. This embodiment relates to an improvement of the embodiment shown in FIG. 12. In FIG. 13, a portion of the appearance of the semiconductor device when one semiconductor chip LSI is mounted on a package substrate is shown. In the embodiment shown in FIG. 12, when the leads are arranged in a multiple rows and the inclination of the leads is aligned to the wire direction, as the leads extend toward the outside, the distance between leads is widened. On the contrary, the distance at corner portions of the inner leads is narrowed and hence, there arises a case in which the wiring layers extending from the outside leads to the through-holes cannot pass over. To obviate such a drawback, in this embodiment, inner circumferential corner portions of the leads which are expanded in the radial direction are notched so as to ensure the space having a width necessary for allowing the wiring layers to pass. Due to such a constitution, it is possible to pull around the wire layers without expanding the bonding area more than necessary.

Figure 14:
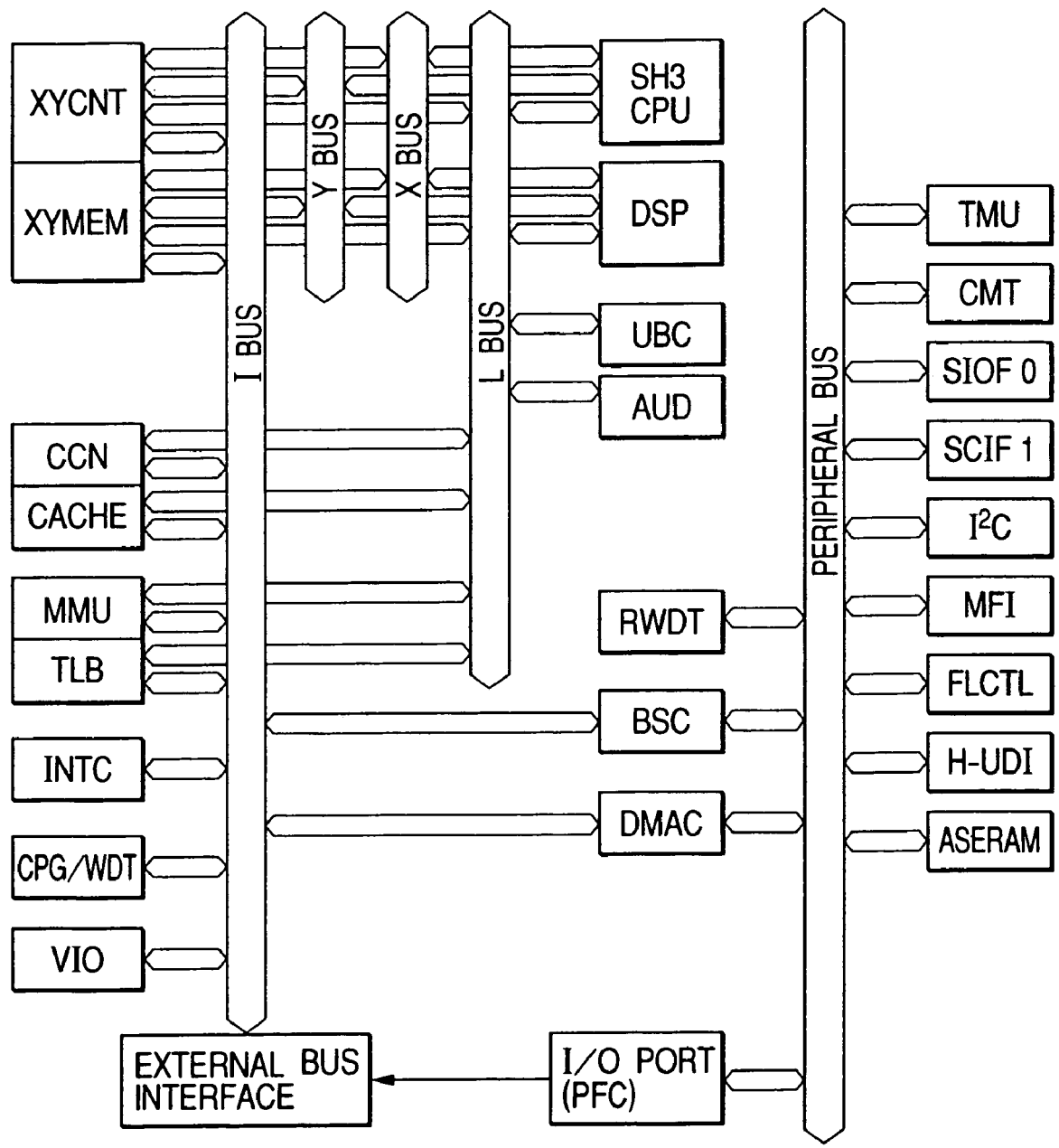
FIG. 14 is a block diagram showing one embodiment of a microcomputer LSI used in the present invention.

FIG. 14 is a block diagram showing one embodiment of a microcomputer LSI used in the present invention. Respective circuit blocks in the drawing are formed on one substrate made of single crystalline silicon using a known fabrication technique of CMOS (complementary MOS) semiconductor integrated circuits.

Although the above-mentioned microcomputer LSI is not specifically limited, the microcomputer LSI realizes high-performance arithmetic processing using a RISC (Reduced Instruction Set Computer) type central processing unit CPU, integrates necessary peripheral equipment for system constitution and is directed to portable equipment application. The central processing unit CPU has a command set of RISC type, wherein basic commands are operated at 1 state by 1 command (1 system clock cycle) by performing pipe-line processing. Using these center processing unit CPU and data signal processor DSP mainly, following peripheral circuits are mounted to constitute a mobile telephone set, for example.

The inner bus includes an I bus, a Y bus, an X bus, an L bus and peripheral buses. To constitute a user system using a least number of parts, as built-in peripheral modules, a memory XYMEM which is directed to image processing and a memory controller XYCNT are provided. These memory XYMEM and memory controller XYCNT are connected to the I bus, the X bus, the Y bus and the L bus and data inputting/outputting of image processing and data outputting operation for display operation are performed.

In the above-mentioned I bus, a cache memory CACHE, a cache memory controller CCN, a memory management controller MMU, a translation look-aside buffer TLB, an interrupt controller INTC, a clock oscillator/watch dog timer CPG/WDT, a video I/O module VIO and an external bus interface are provided. These are connected with the above-mentioned memory LSI via the external bus interface.

To the L bus, the cache memory CACHE, the cache memory controller CCN, the memory management controller MMU, the translation look-aside buffer TLB, the central processing unit CPU, data signal processor DSP, a user break controller UBC and an advanced user debugger AUD are connected.

To the peripheral bus, a 16-bit timer unit TMU, a compare match timer CMT, a serial I/O (with FIFO) SIOFO, a FIFO built-in serial communication interface SCIFI, an I²C controller I²C, a multi-functional interface MFI, a NAND/AND flush interface FLCTL, a user debug interface H-UDI, an ASE memory ASERAM, a pin function controller PFC, and a RCLK operation watch dog timer RWDT are connected. To the above-mentioned peripheral bus and the I bus, a bus state controller BSC and a direct memory access controller DMAC are connected.

Figure 15:
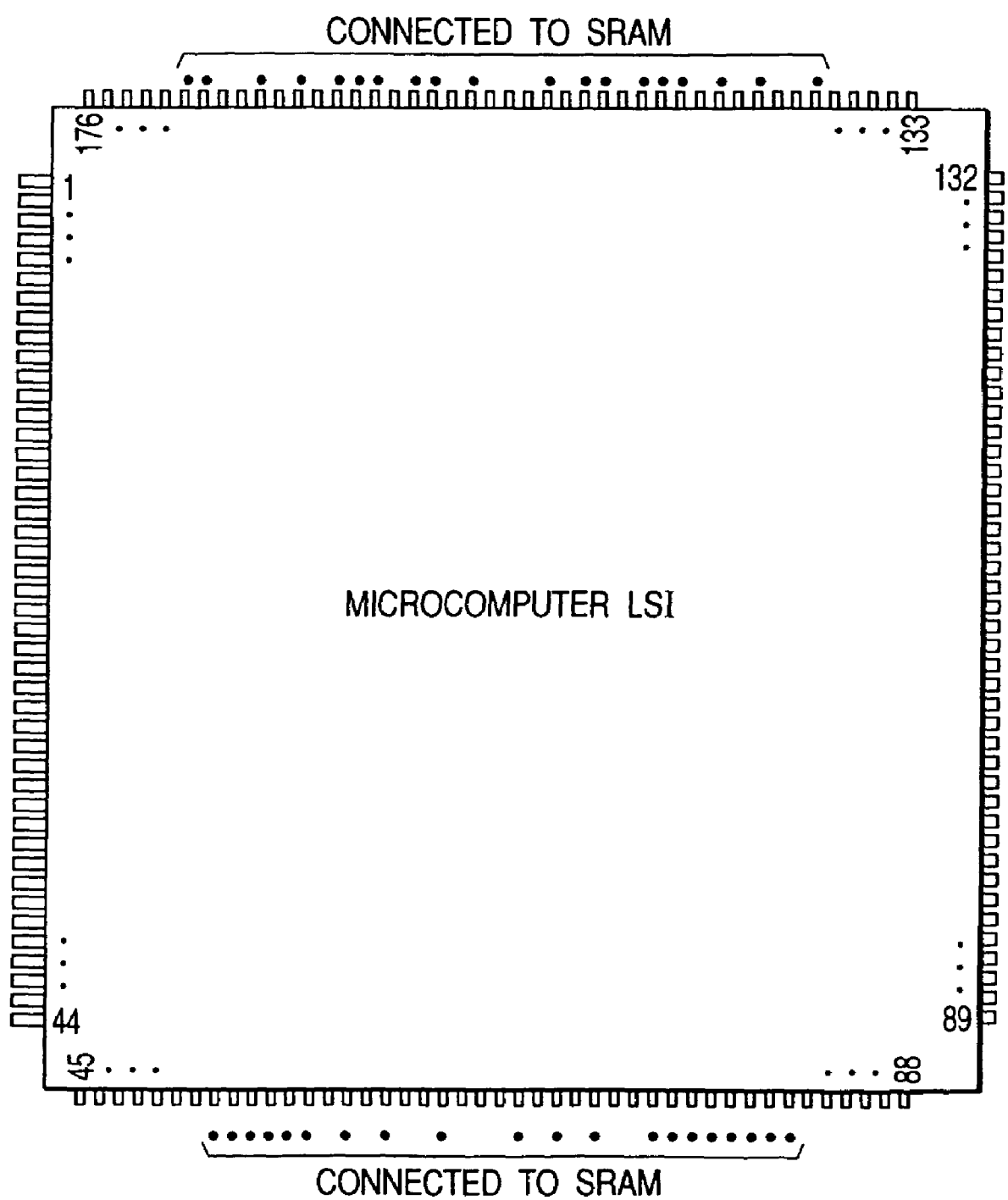
FIG. 15 is a view schematically showing an arrangement of pins for explaining one embodiment of the microcomputer LSI in FIG. 14.

FIG. 15 is a view showing the approximate pin arrangement of one embodiment of the microcomputer LSI shown in FIG. 14. In this embodiment, while there are provided 176 pieces of pins (bonding pads) in total, the pins which are connected to the memory LSI are indicated by black dots. In the same manner as the microcomputer LSI shown in FIG. 1, the pins which correspond to addresses and data are arranged such that they are distributed to upper and lower sides which face each other vertically. In this embodiment, the pins corresponding to data are arranged on the upper side and the pins corresponding to the addresses are arranged on the lower side. To match a pitch of the corresponding pins (bonding pads) of the memory LSI on which the microcomputer LSI is mounted, pins which are connected only to the microcomputer LSI are suitably arranged between the black-dotted pins which are connected to the above-mentioned LSI.

Although not shown in the drawing, with respect to the pins provided to the microcomputer LSI, the pins A0 to A25 are served for addresses and D0 to D15 are served for data. Besides the above, as a power source system, a plurality of power source voltages VCC and a plurality of ground potentials VSS are provided respectively. In the power source system, a digital circuit for reducing influence of noise is divided into an output circuit for performing outputting of signals to external terminals and an inner circuit. Further, independent power source pins are provided for a circuit which handles analog signals.

The memory LSI has storage capacitance of approximately 8 Mbits and performs a memory access per 16 bits, and hence the address includes 19 bits from A0 to A18. Although the microcomputer LSI includes 26 addresses A0 to A25, the addresses which are connected in common with the microcomputer LSI and the memory LSI are 19 pieces, and hence the number of addresses becomes 19+16=35 pieces including addresses for data.

Although not particularly limited, as control signals which are connected in common, there are provided four signals consisting of a signal WE (write enable), a signal OE (output enable), a signal US (upper select) and a signal LS (low select). The signal US serves for instructing writing of upper 8 bits out of 16-bit data and the signal LS serves for instructing writing of lower 8 bits out of 16-bit data. Accordingly, the number of pins which are connected in common by the microcomputer LSI and the memory LSI is small, that is, 39 pieces in total. Accordingly, to match the arrangement of the pins which are connected in common in the above-mentioned manner in the memory LSI, in the microcomputer LSI, the bonding pads for data and the bonding pads for address are arranged in a skipped manner as indicated by black dots in the drawing.

Figure 16:
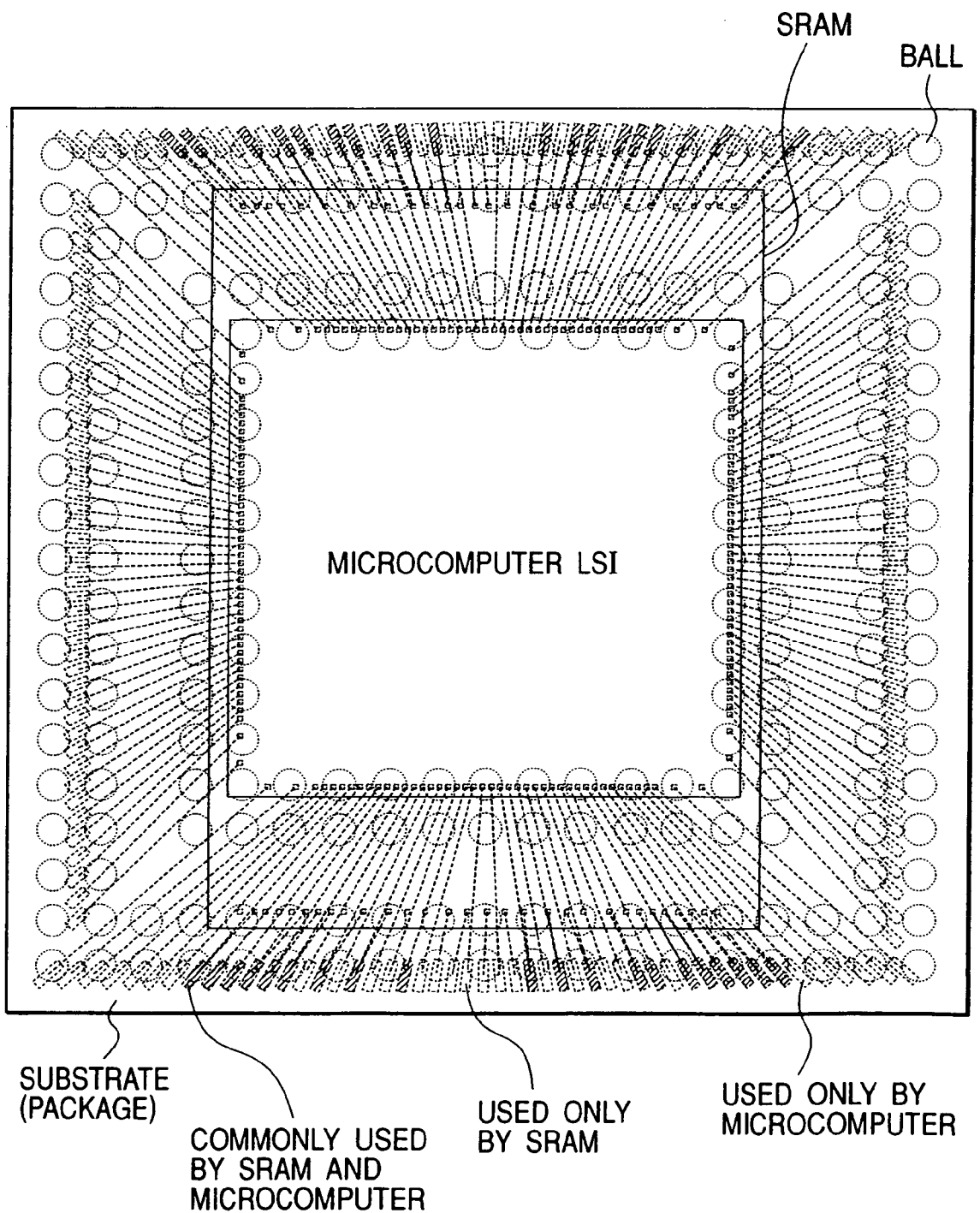
FIG. 16 is an appearance view after mounting the memory LSI and the microcomputer LSI on the substrate of one embodiment of the semiconductor device according to the present invention and performing wire bonding thereafter.

FIG. 16 shows an appearance of one embodiment of the semiconductor device according to the present invention in a state which the memory LSI and the microcomputer LSI are mounted on the substrate, and thereafter, wire bonding is performed. In this embodiment, the stacked package LSI on which the microcomputer LSI which is explained in conjunction with FIG. 14 and FIG. 15 and the memory LSI formed of an approximately 8M bits SRAM are mounted is shown. In the drawing, balls formed on a back surface of the package substrate are indicated by white dots.

Figure 17:
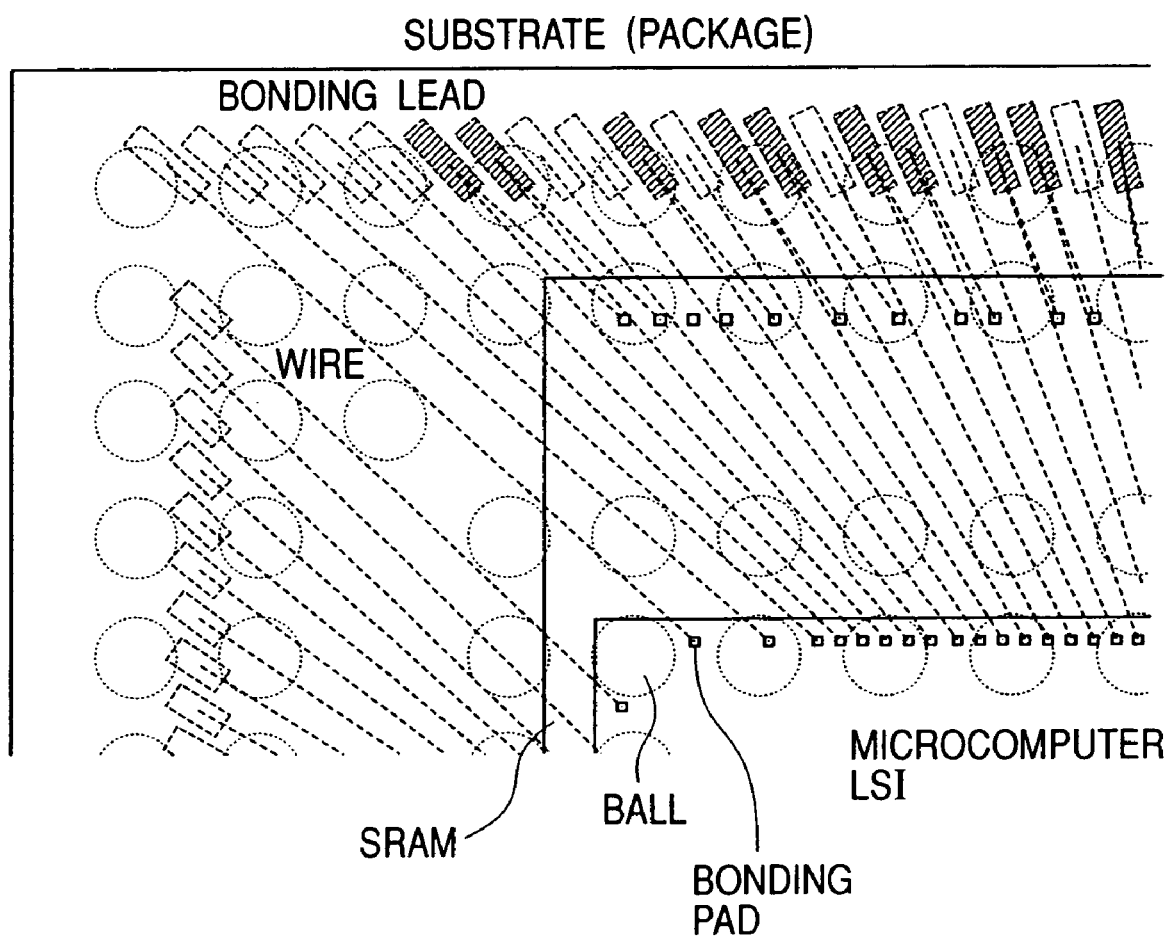
FIG. 17 is a partially enlarged view of FIG. 16.

In this embodiment, out of the bonding leads mounted on the substrate, with respect to the bonding leads which are matted in black, the wires extend from these bonding leads to the memory LSI and the microcomputer LSI and are connected in common. FIG. 17 is a partial enlarged view, wherein the bonding leads are arranged obliquely along the extension direction of the wires such that the wires extending toward the memory LSI and the microcomputer LSI from the bonding leads do not cross each other. First, this constitution prevents the wires extending from the neighboring leads from crossing above the bonding leads.

Figure 18:
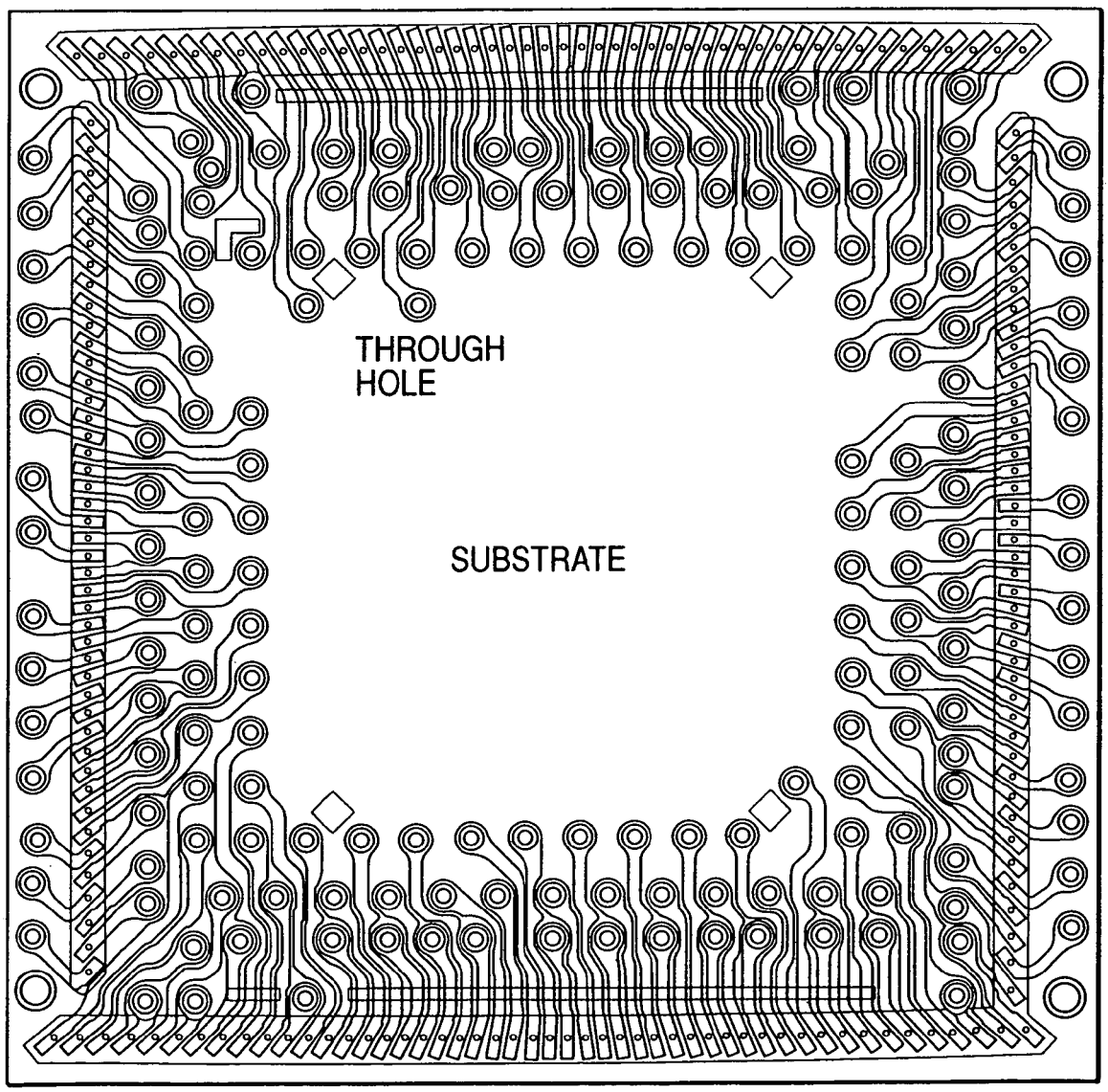
FIG. 18 is a top plan view showing one embodiment of the package substrate used in the semiconductor device shown in FIG. 16.

FIG. 18 is a top plan view of one embodiment of the package substrate used in the semiconductor device shown in FIG. 16. The bonding leads which include the data terminals and address terminals of the above-mentioned memory LSI and the microcomputer LSI are formed on the upper side and a lower side of the substrate. The bonding leads which are formed on the upper and lower sides are arranged along the outermost circumference. On the other hand, with respect to the bonding leads which are connected to only the microcomputer LSI, the through-holes are formed in a dispersed manner at the left and the right with respect to the bonding leads. That is, in the left and right sides, the through-holes are formed at the outermost circumference. The number of the through-holes which are dispersed to the left and right with respect to the above-mentioned bonding leads is not univocally alternately and uniformly divided as in the case of the embodiment shown in FIG. 1. That is, the number of the through-holes is suitably determined by considering the space over the substrate.

Figure 19:
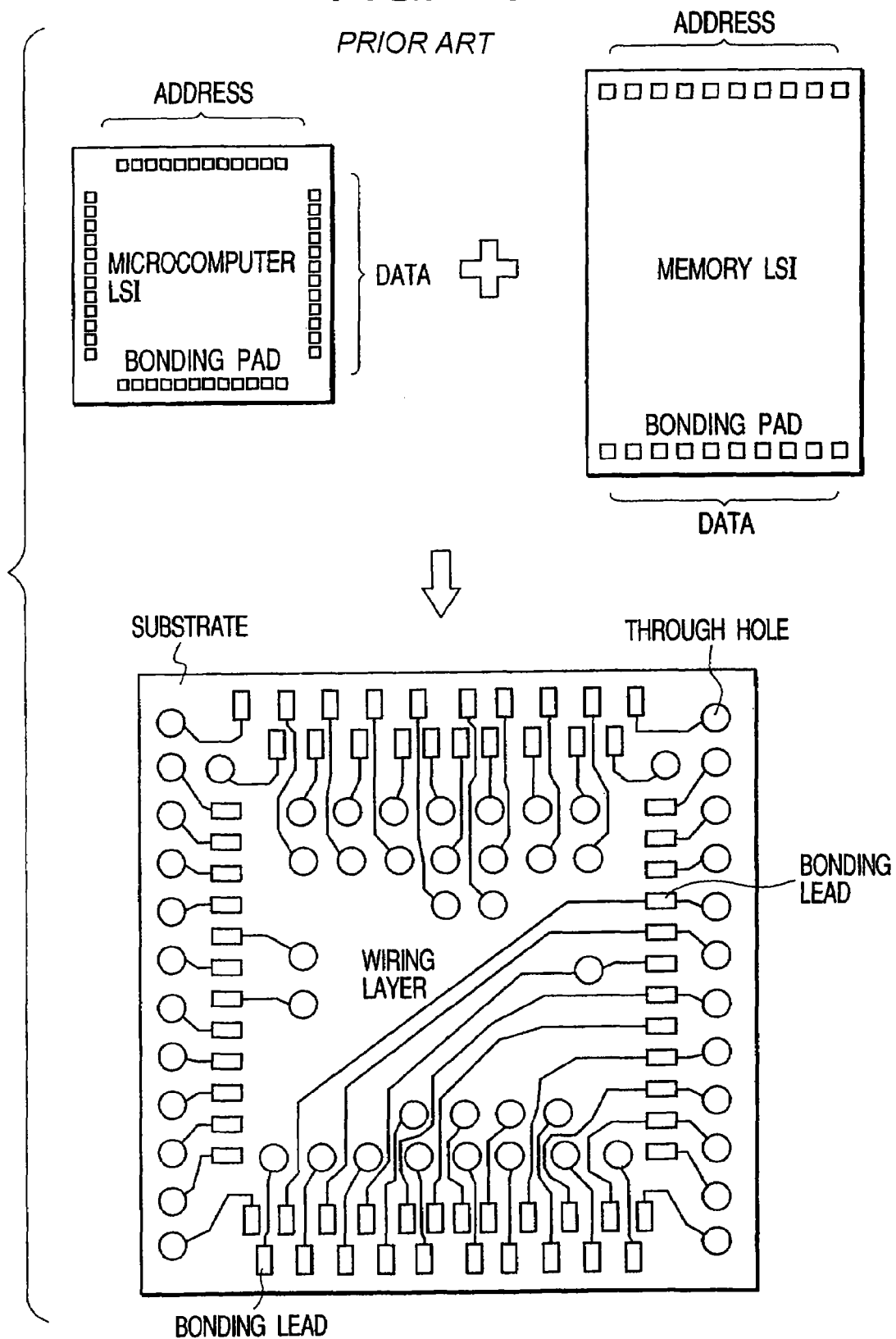
FIG. 19 is a view showing the constitution of a microcomputer LSI, a memory LSI and a package substrate for explaining one embodiment of a stacked package LSI which was reviewed prior to the present invention.
Figure 20:
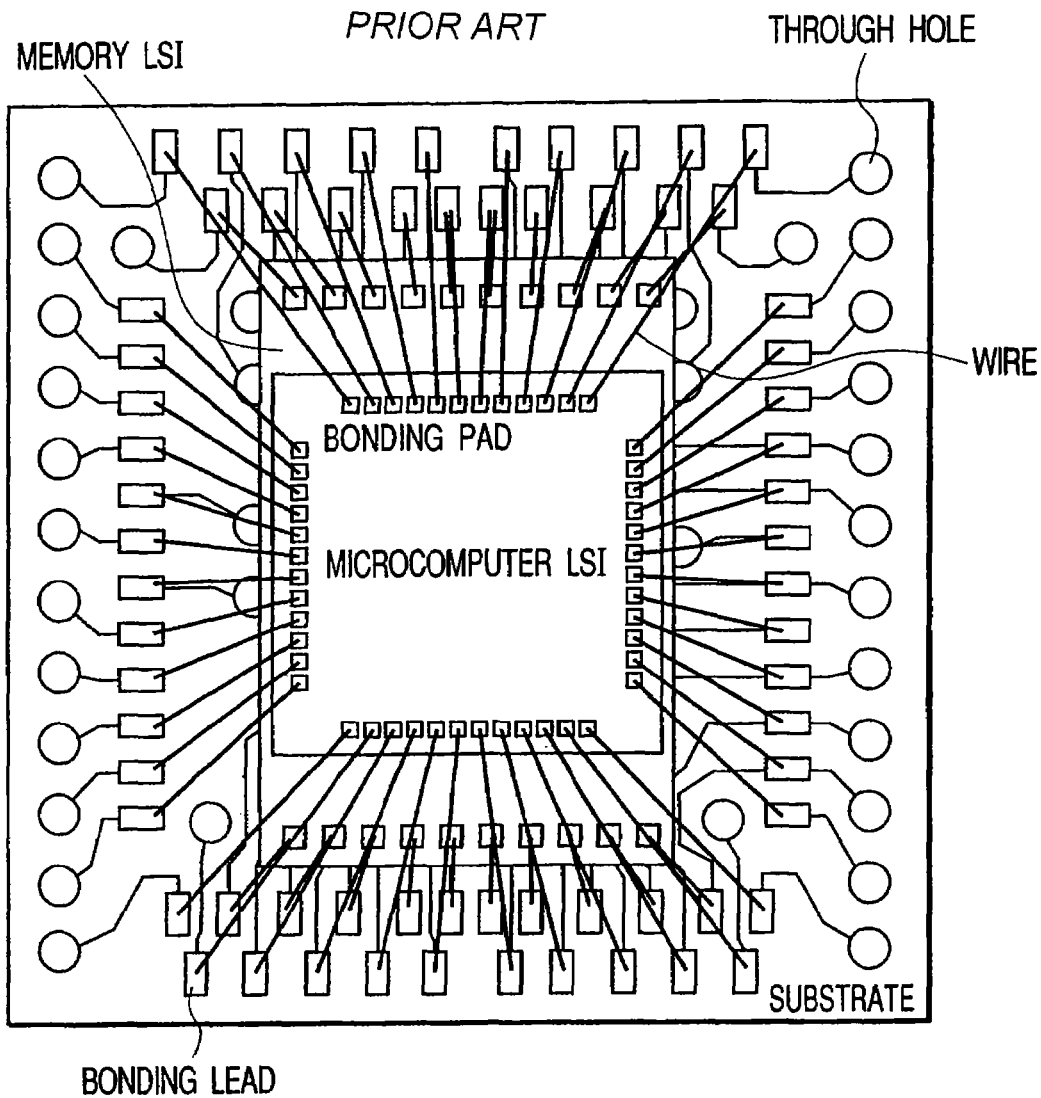
FIG. 20 is an appearance view of the semiconductor device after mounting the memory LSI and the microcomputer LSI on the substrate shown in FIG. 19 and performing wire bonding thereafter.

In the above-mentioned embodiment, it is possible to suppress the pull around of wiring layers on the substrate package to a minimum, and hence it is possible to make the contour size as small as possible. Due to the elimination of crossing wiring layers, the connection of package wiring layers can be performed at both of the front and rear layers, and hence it is possible to use a thin and inexpensive substrate. Further, it is also possible to reduce the thickness of the mold portion by suppressing crossing of wires. Incidentally, when the semiconductor device is constituted as shown in FIG. 19 which is studied prior to the present invention, LFBGA can be obtained only at a level of 1.4 mm square. According to the constitution shown in FIG. 16, it is possible to realize a semiconductor device which is smaller than the semiconductor device shown in FIG. 19 by one rank such that the TFBGA can be arrayed at 1.2 mm square.

Although the inventions which have been made by the inventors are specifically explained in conjunction with several embodiments, it is needless to say that the present invention is not limited to the above-mentioned embodiments and various modifications are conceivable without departing from the gist of the present invention. For example, the memory LSI may be, besides the above-mentioned SRAM, a dynamic RAM or a flush memory (EEPROM). The microcomputer LSI may be any type of digital signal processing circuit including a microprocessor or the like. The present invention is, besides the above-mentioned stacked package LSI, widely applicable to a semiconductor device which mounts one semiconductor chip on a substrate and adopts a package of BGA constitution.

To briefly explain advantageous effects obtained by typical inventions among the inventions disclosed by the present application, they are as follows. The semiconductor device uses the package substrate on which the bonding leads which are formed respectively corresponding to bonding pads for address and data which are distributed to the opposing first and second sides of the memory chip, and the address terminals and data terminals which are connected to the bonding leads are formed. The semiconductor device further includes the address output circuit and data input/output circuit which are also served for memory access and the signal processing circuit having the data processing function. The semiconductor chip in which the bonding pads which are connected to the bonding leads corresponding to the address terminals of the package substrate and the bonding pads which are connected to the bonding leads corresponding to the data terminals of the package substrate are distributed to two sides out of four sides and the above-mentioned memory chip are mounted on the package substrate in a stacked structure. Accordingly, it is possible to suppress the pull-around of wiring layers on the substrate package to a minimum. It is also possible to make the contour size of the semiconductor device as small as possible. Further, since the connection of wiring layers can be performed both of the front and rear layers, it is possible to use a thin and inexpensive substrate.

What is claimed is:

1. A semiconductor device comprising:
   a wiring substrate including a plurality of bonding leads;
   a memory chip mounted over said wiring substrate, said memory chip having a plurality of first bonding pads;
   a microcomputer chip mounted over said memory chip, said microcomputer chip having a plurality of second bonding pads, an address output circuit for memory access, a data input/output circuit for memory access and a signal processing circuit having a data processing function,
   a plurality of first wires electrically connecting said plurality of first bonding pads of said memory chip with a first predetermined group of said bonding leads of said wiring substrate;
   a plurality of second wires electrically connecting said plurality of second bonding pads of said microcomputer chip with a second predetermined group of said bonding leads of said wiring substrate; and
   a resin body sealing said memory chip, said microcomputer chip, said plurality of first wires and said plurality of second wires;
   wherein said first and second predetermined groups of bonding leads, said plurality of first bonding pads, and said plurality of second bonding pads are arranged along corresponding first sides of said wiring substrate, said memory chip, and said microcomputer chip,
   wherein said plurality of first bonding pads of said memory chip are exposed from said microcomputer chip, and
   wherein said first and second predetermined groups of bonding leads include bonding leads of substantially rectangular configuration with longer sides arranged at acute angles with respect to the first side of said wiring substrate.

2. A semiconductor device according to claim 1, wherein said memory chip has a side longer than the first side thereof;
   wherein said microcomputer chip has a plurality of sides; and
   wherein said longer side of said memory chip is longer than each of said sides of said microcomputer chip.

3. A semiconductor device according to claim 2, wherein said longer side of said memory chip is longer than all sides of said microcomputer chip.

4. A semiconductor device according to claim 2, wherein said microcomputer chip is square in plan view.

5. A semiconductor device according to claim 1, wherein said first and second predetermined groups of bonding leads include at least one bonding lead in common.

6. A semiconductor device according to claim 1, wherein said wiring substrate is of quadrilateral shape in plan view.

7. A semiconductor device according to claim 1,
   wherein said memory chip has a plurality of third bonding pads,
   said microcomputer chip has a plurality of fourth bonding pads,
   a plurality of third wires electrically connect said plurality of third bonding pads of said memory chip with a third predetermined group of said bonding leads of said wiring substrate,
   a plurality of fourth wires electrically connect said plurality of fourth bonding pads of said microcomputer chip with a fourth predetermined group of said bonding leads of said wiring substrate, said plurality of third wires and said plurality of fourth wires are sealed by said resin body, said third and fourth predetermined groups of bonding leads, said plurality of third bonding pads, and said plurality of fourth bonding pads are arranged along corresponding second sides of said wiring substrate, said memory chip, and said microcomputer chip opposite to the respective first sides thereof, said plurality of third bonding pads of said memory chip are exposed from said microcomputer chip, and said third and fourth predetermined groups of bonding leads include bonding leads of substantially rectangular configuration with longer sides arranged at acute angles with respect to the second side of said wiring substrate.

8. A semiconductor device according to claim 7, wherein said memory chip has a side longer than the first side thereof;

wherein said microcomputer chip has a plurality of sides; and wherein said longer side of said memory chip is longer than each of said sides of said microcomputer chip.

9. A semiconductor device according to claim 8, wherein said longer side of said memory chip is longer than all sides of said microcomputer chip.

10. A semiconductor device according to claim 8, wherein said microcomputer chip is square in plan view.

11. A semiconductor device according to claim 8, wherein said third and fourth predetermined groups of bonding leads include at least one bonding lead in common.

12. A semiconductor device according to claim 8, wherein said wiring substrate is of quadrilateral shape in plan view.

* * * * *